United States Patent
Brewer et al.

(10) Patent No.: US 7,351,660 B2
(45) Date of Patent: Apr. 1, 2008

(54) PROCESS FOR PRODUCING HIGH PERFORMANCE INTERCONNECTS

(75) Inventors: Peter D. Brewer, Westlake Village, CA (US); Carl W. Pobanz, Rancho Palos Verdes, CA (US)

(73) Assignee: HRL Laboratories, LLC, Malibu, CA (US)

( * ) Notice: Subject to any disclaimer, the term of this patent is extended or adjusted under 35 U.S.C. 154(b) by 370 days.

(21) Appl. No.: 10/256,334

(22) Filed: Sep. 26, 2002
(Under 37 CFR 1.47)

(65) Prior Publication Data

US 2003/0112576 A1    Jun. 19, 2003

Related U.S. Application Data

(60) Provisional application No. 60/326,076, filed on Sep. 28, 2001, provisional application No. 60/326,056, filed on Sep. 28, 2001, provisional application No. 60/326,055, filed on Sep. 28, 2001, provisional application No. 60/326,054, filed on Sep. 28, 2001.

(51) Int. Cl.
*H01L 21/302* (2006.01)

(52) U.S. Cl. .................. 438/689; 438/700; 438/703; 216/44; 216/52

(58) Field of Classification Search ............... 438/689, 438/700, 703; 216/44, 52
See application file for complete search history.

(56) References Cited

U.S. PATENT DOCUMENTS

| | | | |
|---|---|---|---|
| 4,912,844 A | 4/1990 | Parker | 29/848 |
| 5,032,896 A | 7/1991 | Little et al. | 257/686 |
| 5,161,093 A | 11/1992 | Gorczyca et al. | 361/414 |
| 5,284,548 A | 2/1994 | Carey et al. | 156/630 |
| 5,312,765 A | 5/1994 | Kanber | 437/22 |
| 5,324,687 A | 6/1994 | Wojnarowski | 438/107 |
| 5,353,498 A | 10/1994 | Fillion et al. | 29/840 |

(Continued)

FOREIGN PATENT DOCUMENTS

EP    0 982 385 A1    3/2000

(Continued)

OTHER PUBLICATIONS

Chou, Stephen Y., et al, "Imprint of Sub-25 NM Vias and Trenches in Polymers," *Applied Physics Lett.*, American Institute of Physics, vol. 67, No. 21, pp. 3114-3116 (Nov. 20, 1995).

(Continued)

*Primary Examiner*—Nadine G. Norton
*Assistant Examiner*—Lynette T. Umez-Eronini
(74) *Attorney, Agent, or Firm*—Ladas & Parry

(57) ABSTRACT

A method for fabricating high performance vertical and horizontal electrical connections in a three dimensional semiconductor structure. A dielectric film is imprinted with a stamp pattern at high vacuum and with precise temperature and stamping pressure control. The stamp pattern may be formed on a substrate using semiconductor fabrication techniques. After the dielectric film is stamped, residual dielectric film is removed to allow access to an underlying layer. Via and trench regions formed within the dielectric film by stamping are then metalized to provide the high performance interconnections. Multiple layers of interconnections in the three dimensional structure are provided by stacking layers of stamped and metalized dielectric films on top of each other.

29 Claims, 8 Drawing Sheets

U.S. PATENT DOCUMENTS

| | | | |
|---|---|---|---|
| 5,485,038 A | 1/1996 | Licari et al. | 257/758 |
| 5,489,554 A | 2/1996 | Gates | 437/208 |
| 5,545,291 A | 8/1996 | Smith et al. | 156/655.1 |
| 5,609,907 A | 3/1997 | Natan | 427/2.12 |
| 5,751,018 A | 5/1998 | Alivisatos et al. | 257/64 |
| 5,772,905 A | 6/1998 | Chou | 216/44 |
| 5,783,856 A | 7/1998 | Smith et al. | 257/618 |
| 5,800,650 A | 9/1998 | Anderson et al. | 156/150 |
| 5,824,186 A | 10/1998 | Smith et al. | 156/655.1 |
| 5,861,670 A | 1/1999 | Akasaki | 257/737 |
| 5,877,550 A | 3/1999 | Suzuki | 257/700 |
| 5,904,545 A | 5/1999 | Smith et al. | 438/455 |
| 6,037,255 A | 3/2000 | Hussein et al. | 438/675 |
| 6,096,386 A | 8/2000 | Biebuyck et al. | 427/510 |
| 6,130,823 A | 10/2000 | Lauder et al. | 361/760 |
| 6,165,911 A | 12/2000 | Calveley | 438/754 |
| 6,294,741 B1 | 9/2001 | Cole, Jr. et al. | 274/260 |
| 6,326,058 B1 | 12/2001 | Biebuyck et al. | 427/261 |
| 6,417,025 B1 | 7/2002 | Gengel | 438/107 |
| 6,479,395 B1 | 11/2002 | Smith et al. | 438/723 |
| 6,500,694 B1 | 12/2002 | Enquist | 438/109 |
| 6,541,346 B2 | 4/2003 | Malik | 438/316 |
| 6,579,463 B1 | 6/2003 | Winningham et al. | 216/41 |
| 6,586,338 B2 | 7/2003 | Smith et al. | 438/692 |
| 6,611,237 B2 | 8/2003 | Smith | 343/772 |
| 6,652,808 B1 | 11/2003 | Heller et al. | 422/68.1 |
| 6,656,568 B1 | 12/2003 | Winningham et al. | 428/145 |
| 6,657,289 B1 | 12/2003 | Craig et al. | 257/678 |
| 6,946,322 B2 | 9/2005 | Brewer | 438/109 |
| 2002/0005294 A1 | 1/2002 | Mayer et al. | 174/260 |
| 2002/0045030 A1 | 4/2002 | Ozin et al. | 428/173 |
| 2003/0062123 A1 | 4/2003 | Hunter et al. | 156/310 |
| 2003/0068519 A1 | 4/2003 | Brewer et al. | 428/620 |
| 2003/0140317 A1 | 7/2003 | Brewer et al. | 716/1 |

FOREIGN PATENT DOCUMENTS

| | | |
|---|---|---|
| JP | 10-022338 | 1/1998 |

OTHER PUBLICATIONS

Chou, Stephen Y., et al, "Nanoimprint Lithography," *J. Vac. Sci. Technol. B*, American Vacuum Society, vol. 14, No. 6, pp. 4129-4133 (Nov./Dec. 1996).

"Method to Control the Geometry and Vertical Profile of Via Holes in Substrate Materials," *IBM Technical Disclosure Bulletin*, vol. 35, No. 5, pp. 211-216 (Oct. 1992).

Terfort, Andreas, et al, "Self-Assembly Of An Operating Electrical Circuit Based On Shape Complementarity And The Hydrophobic Effect," *Advanced Materials*, vol. 10, No. 6, pp. 470-473, (1998).

Terfort, Andreas, et al, "Three-Dimensional Self-Assembly of Millimetre-Scale Components," *Nature*, vol. 386, pp. 162-164, (Mar. 13, 1997).

"Use of High Precision Silicon Molds for Replicating Microelectronic Packaging Structures," *IBM Technical Disclosure Bulletin*, vol. 30, No. 5, pp. 306-311 (Oct. 1987).

Bobbio, S.M., et al., "Integrated Force Arrays," *IEEE Proceedings of the Workshop on Micro Electro Mechanical Systems (MEMS)*, Fort Lauderdale, pp. 149-154 (Feb. 7-10, 1993).

Srinivasan, U., et al., "Fluidic Self-Assembly of Micromirrors onto Surface Micromachined Actuators," *IEEE*, pp. 59-60, (2000).

Srinivasan, U., et al., "Microstructure to Substrate Self-Assembly Using Capillary Forces," *Journal of Microelectromechanical Systems*, vol. 10, No. 1, pp. 17-24 (Mar. 2001).

Hao, E., et al., "Buildup of Polymer/Au Nanoparticle Multilayer Thin Films Based on Hydrogen Bonding," *Chem. Mater.*, vol. 12, No. 11, pp. 3392-3396 (2000).

Kumar, A., et al., "Pattering Self-Assembled Monolayers: Applications in Materials Science," *Langmuir*, vol. 10, No. 5, pp. 1498-1511 (1994).

U.S. Appl. No. 10/888,169 by Peter D. Brewer, filed on Jul. 8, 2004.

Böhringer, K.F., et al., "Modeling of Capillary Forces and Binding Sited For Fluidic Self-Assembly," *MEMS: 2001: The 14th IEEE International Conference on Micro Electro Mechanical Systems*, pp. 369-374 (2001).

Cohn, M.B., et al., "Microassembly Tehnologies For MEMS," *SPIE Micromachining and Microfabrication, Conference on Micromachining and Microfabrication Process Technology IV*, Santa Clara, CA, 15 pages total (Sep. 21-22, 1998).

Gracias, D.H., "Forming Electrical Networks In Three Dimensions by Self-Assembly," *Science*, vol. 289, pp. 1170-1172 (Aug. 18, 2000).

Hadley, M.A., "Vertical-Cavity Surface-Emitting Laser Diodes: Design, Growth, Mode Control and Integration by Fluidic Self-Assembly," *UMI Dissertation Services*, Sections 5.4, 5.5, and 5.6, pp. 75-81 (1994).

Saitou, K., et al., "Externally Resonated Linear Microvibromotor For Microassembly," *Journal of Microelectromechanical Systems*, vol. 9, No. 3, pp. 336-346 (Sep. 2000).

Bains, S., "Circuit Blocks Attached Via DNA," *Electronic Engineering Times*, pp. 39-44 (Mar. 9, 1998).

Bains, S., "Double Helix Doubles as Engineer," *Science*, vol. 279, pp. 2043-2044 (Mar. 27, 1998).

Borzenko, T., et al., "Polymer bonding process for nanolithography," *Applied Physics Letters*, vol. 79, No. 14, pp. 2246-2248 (Oct. 1, 2001).

Chou, S.Y., et al., "Imprint of sub-25 nm vias and trenches in polymers," *Appl. Phys. Lett.*, vol. 67, No. 21, pp. 3114-3116 (Nov. 20, 1995).

Chou, S.Y., et al., "Nanoimprint lithography," *J. Vac. Sci. Technol. B*, vol. 14, No. 6, pp. 4129-4133 (Nov./Dec. 1996).

Tormen, M., et al., "Thermocurable polymers as resists for imprint lithography," *Electronics Letters*, vol. 36, No. 11, pp. 983-984 (May 25, 2000).

Zhang, W., et al., "Multilevel nanoimprint lithography with submicron alignment over 4 in. Si wafers," *Applied Physics Letters*, vol. 79, No. 6, pp. 845-847 (Aug. 6, 2001).

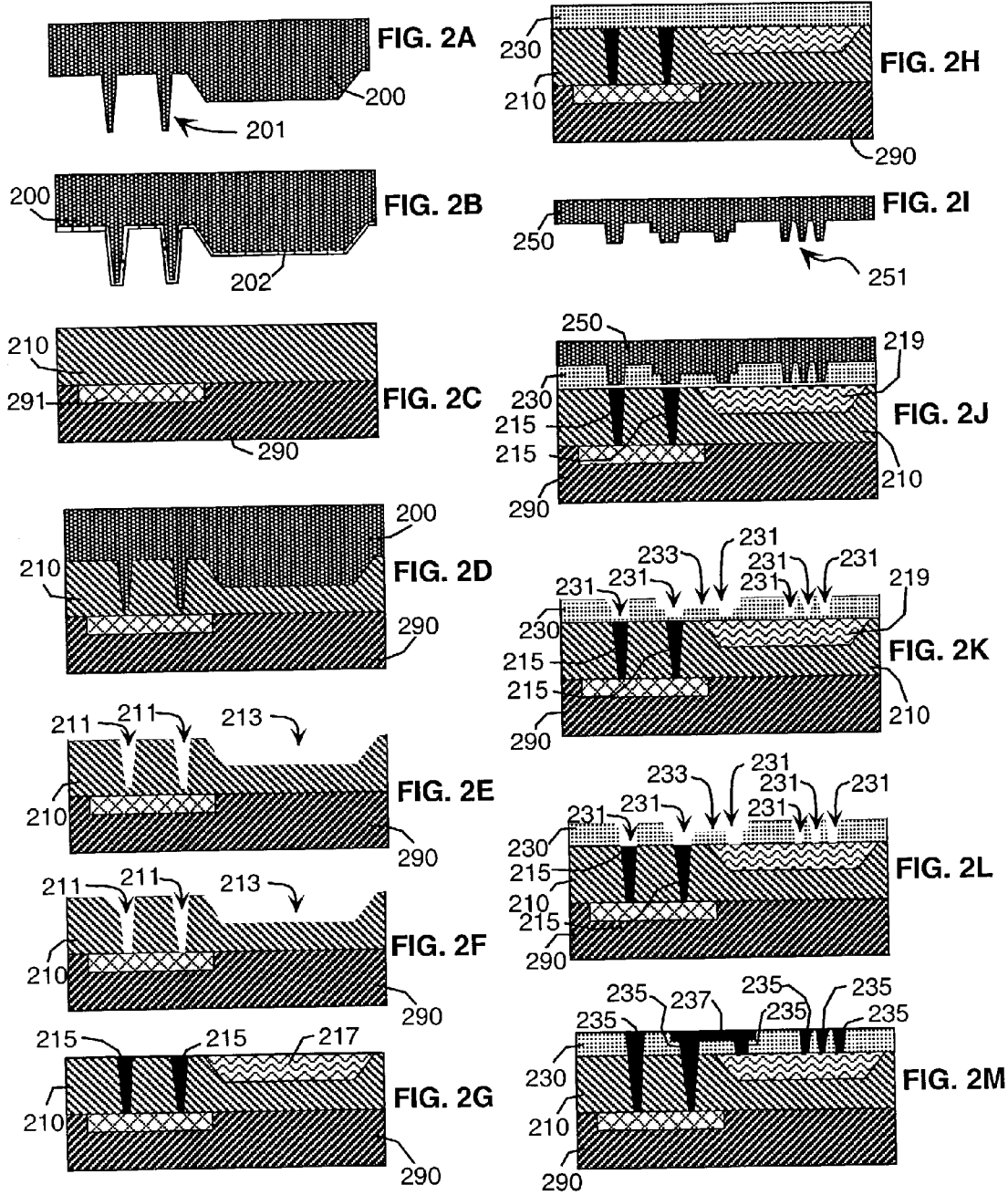

PROCESS FOR PRODUCING HIGH PERFORMANCE INTERCONNECTS

CROSS-REFERENCE TO RELATED APPLICATIONS

The present document is related to the copending and commonly assigned patent application documents entitled: "Process for Producing High Performance Interconnects," Ser. No. 60/326,054; "Process for Assembling Three-Dimensional Systems on a Chip and Structure Thus Obtained," Ser. No. 60/326,076; "Method For Assembly Of Complementary-Shaped Receptacle Site And Device Microstructures," Ser. No. 60/326,055; and "Method of Self-Latching for Adhesion During Self-Assembly of Electronic or Optical Circuits," Ser. No. 60/326,056, all of which were filed on Sep. 28, 2001. The contents of these related applications are hereby incorporated by reference herein.

BACKGROUND

1. Field

The present invention relates to processes for producing electrical interconnects, and, more particularly, processes for producing high performance transmission lines and interconnects between integrated circuits, discrete devices, and passive components in highly integrated three-dimensional structures.

2. Description of Related Art

Increasingly complex electronic systems require increasingly denser structures of integrated circuits, passive components, and other discrete elements. Typical two-dimensional structures, where the elements are laid out on a printed circuit board or similar structure, no longer meet the size, weight, and performance requirements of advanced electronic systems. Hence, three-dimensional structures are being used to provide the needed levels of electronic circuit integration. These three-dimensional structures generally comprise multiple layers of devices along with multiple layers of interconnects to provide electrical connections between the devices.

One approach for providing interconnects in a multiple layer structure is that used in high-density multilayer interconnect (HDMI) techniques. J. L. Licari and D. J. Smith in U.S. Pat. No. 5,485,038, issued Jan. 16, 1996, describe an HDMI structure using alternating conductor metallization and insulating layers. Licari, et al. disclose dielectric layers formed by curtain coating of ultraviolet photoimageable epoxy material and conductor layers formed on the dielectric layers by thin film printing, sputtering or plating. Vertical interconnects (vias) are formed through the dielectric layers to interconnect the metallization pattern on adjacent conductor layers.

The conventional polyimide materials used for RF packaging are not photoimageable. Thus, the metallization patterns and interlayer vias must be formed by photolithography, which typically involves applying, imaging, developing and removing a photoresist layer for each metallization and dielectric layer. Many process steps are thereby required for each layer. Plasma etching using photoresist is generally used to form the interconnect structures.

Plasma etching methods are limited in their ability to produce complex structures and are also restricted by practical considerations in the vertical depth of the features (a few microns). The depth restriction is due to the low etch rates of most plasma etching schemes for etching polymers (<3000 Å/min) and the lack of robust material masking. Complex structures such as via holes with tapered sidewalls, terraced structures or asymmetrically shaped features are also difficult to produce using plasma etching. Some laboratories have reported forming via holes in polyimide polymer films with sloped sidewalls. The method employed uses tapered erosion masks to obtain sloped etch features, but is limited in the range of sidewall angles and the depth of the etched features. Producing asymmetric structures (i.e., different sidewall profiles) is beyond the capability of current plasma etching technology.

S. Y. Chou in U.S. Pat. No. 5,772,905, "Nanoimprint Lithography," issued Jun. 30, 1998, describes a process for molding structures in thermoplastic polymer film to create ultra-fine structures on or in a substrate. Chou discloses a nanoimprint process that presses a mold into the polymer film to form holes and trenches with high aspect ratios in structures less than 25 nanometers. The mold may consist of a thick layer of silicon dioxide on a silicon substrate and is patterned using electron beam lithography, reactive ion etching (RIE), and other methods. To form the vias and trenches, the mold is pressed into polymethylmethacrylate (PMMA) film spun on a silicon wafer. RIE is used to remove PMMA residue from the bottom of the molded via and trench regions. The vias and trenches are then metalized by using an evaporation technique. Alternatively, the molded and etched film may be used as a mask to support the formation of recesses in the substrate by an etching process. The recesses in the substrate can then be used to support further processing steps.

The techniques disclosed by Chou address the creation of two-dimensional ultra-fine structures on or in a substrate. However, there exists a need in the art for the creation of three-dimensional structures in multiple layers at or above a substrate. There also exists a need in the art for creating interconnection structures in dielectric materials to provide for connections between layers in a multiple layer structure using a minimum number of steps for the process. Furthermore, there exists a need in the art for a process that provides for the creation of complex interconnection structures such as tapered sidewalls, terraced structures, or asymmetrically shaped features in multiple layer structures.

SUMMARY

It is an object of the present invention to provide a method for forming high performance interconnections in a three-dimensional structure. It is a further object of the present invention to provide a method for the creation of complex interconnection structures such as tapered sidewalls, terraced structures, or asymmetrically shaped features in multiple layer structures. The term "high performance interconnection" is used herein to refer to any electrical interconnection that supports the connection of high speed signals, such as radio frequency signals or digital signals with fast rise and fall times, among components without detrimentally affecting the quality of the signal.

One embodiment of the present invention provides a method for producing high performance electrical interconnections in a three-dimensional semiconductor structure, comprising the steps of: applying a dielectric film to a top portion of the three dimensional semiconductor structure; providing a stamp substrate; etching the stamp substrate to create a stamp pattern with raised areas; aligning the stamp substrate to the dielectric film; imprinting the dielectric film with the stamp pattern on the stamp substrate so as to create via regions and trench regions in the dielectric film; removing residual film from the via and trench regions of the dielectric film; and metallizing the via and trench regions of the dielectric film.

Another embodiment of the present invention provides a method for producing high performance electrical interconnections in a three dimensional semiconductor structure, comprising the steps of: providing a stamp substrate; etching the stamp substrate to create a stamp pattern with raised areas; providing a dielectric film; aligning the stamp substrate to the dielectric film; imprinting the dielectric film with the stamp pattern on the stamp substrate so as to create via regions and trench regions in the dielectric film; aligning the dielectric film to a top portion of the three dimensional semiconductor structure; bonding the dielectric film to the three dimensional semiconductor structure; removing residual film from the via and trench regions of the dielectric film; and metallizing the via and trench regions of the dielectric film.

Other embodiments of the present invention provide methods for forming high performance interconnects such as coplanar interconnects, coaxial waveguides, shielded, horizontal transmission lines, or electrical structures such as external resonators or spiral inductors. These interconnects and structures may be formed by stamping dielectric layers and metallizing those layers as described herein. Those skilled in the art would understand that structures other than those specifically described herein may also be fabricated using methods according to the present invention.

BRIEF DESCRIPTION OF THE DRAWINGS

FIGS. 2A-2M illustrate the steps of a method according to one embodiment of the present invention.

DETAILED DESCRIPTION OF PREFERRED EMBODIMENTS

Figure 1:
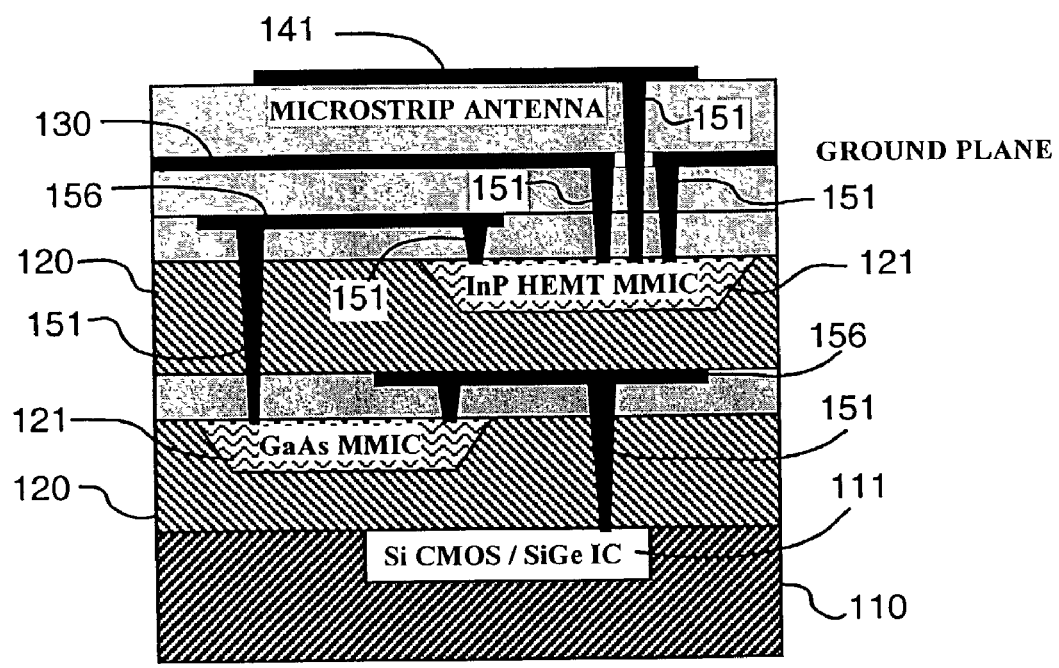
FIG. 1 illustrates the interconnects provided by embodiments of the present invention used in a highly integrated three dimensional structure.

The purpose of the present invention is to provide a process for producing vertical and horizontal electrical interconnects to be utilized in a three-dimensional structure, such as the three-dimensional structure shown in FIG. 1. Low loss, controlled-impedance transmission lines and interconnects for both intra- and inter-layer signal propagation are critical to highly integrated three-dimensional assemblies for high-speed digital and RF applications.

FIG. 1 shows a typical three-dimensional structure for which the interlevel and intralevel connections are provided by the present invention. Interlevel connections are provided by vias 151. The vias 151 provide interlevel connections to integrated circuits 111 in a substrate 110, integrated circuits 121 embedded in polymer layers 120, horizontal interconnections 156, ground planes 130, and sensor elements 141. Intralevel connections are provided by horizontal interconnections 156 on top of polymer layers 120 or contained within recesses in polymer layers 120.

The process of the present invention is provided by stamping uniquely shaped through-layer via holes and recesses that serve as structural pre-forms for metallization of complex interconnect structures. The method uses master stamps fabricated from semiconductor materials that provide a low cost means to produce arrays of precisely shaped recesses in polymer films. The stamp pattern is fabricated using standard IC processes, including photolithography, wet chemical etching and/or dry etching techniques. A wide variety of sidewall shapes and angles can be obtained by employing different etching procedures and/or by selecting different crystallographic orientations and masking procedures on the stamp face. The stamping process is capable of forming micron-size structures with high aspect ratios (~100:1) and can produce features down to 10 nanometers. The present invention represents a major departure from conventional methods for fabricating multiple layer interconnects, which are limited in the complexity and size of possible pre-form structures. Embodiments of the present invention provide an entirely new class of RF and high-speed digital interconnects for highly integrated 3-D systems-on-a-chip, offering improved performance, simplified fabrication, and reduced cost.

One embodiment of the process for producing high performance interconnects is illustrated in FIGS. 2A to 2M. In FIG. 2A, a stamp pattern 201 is formed on a single crystal silicon wafer 200. Single crystal silicon wafers are preferred for the formation of the stamp patterns, since the patterns are easily fabricated using existing techniques. There are many well-known techniques for isotropically, anisotropically and crystallographically etching single crystal silicon surfaces. The process to delineate the stamp or relief pattern on the wafer uses semiconductor manufacturing techniques such as photolithographic patterning of the wafer surface followed by etching of the silicon using wet-chemical etching or plasma etching techniques. These semiconductor manufacturing techniques allow the formation of microstructures including high aspect (vertical sidewall) structures, crystallographic (angled sidewall) structures, and isotropic (curved sidewall) structures on the stamp. Dry etching methods, in particular, are capable of fabricating dense arrays of highly anisotropic micron-sized structures. The stamp serves to imprint "pre-form" structures in a dielectric film into which metal films will be deposited to form the required electrical interconnects.

Stamp patterns may be formed on any material that is harder than the material that is to be imprinted with the stamp. Accordingly, a stamp pattern may be formed in a silicon dioxide layer deposited on a substrate by using semiconductor fabrication techniques. A stamp pattern may also be formed by recasting a formed exotic material into a metal stamp. However, non-crystalline materials such as silicon dioxide cannot be crystallographically etched and may be limited in the range of available patterns that can be shaped in such non-crystalline materials. Therefore, formation of a stamp pattern directly on single crystal silicon is preferred.

As shown in FIG. 2B, the surface of the silicon wafer 200 with the stamp pattern 201 is treated with a release agent 202. The best results have been obtained using a spin-on release agent, such as dimethlypolysiloxane (commercially available as Dura Kote™ produced by Slide Products Inc., Wheeling, Ill.), applied directly on the surface of the silicon wafer 200 containing the etched stamp pattern 201. The release agent is usable up to 300° C. Alternatively, the silicon surface may be coated with a gold film and the surface of the gold film treated with an alkylthiol compound ($C_{10}H_{22}S$). This treatment forms a thick monolayer, chemically-bonded film on the stamp surface that acts as an effective release agent. This treatment, however, is limited to less than 150° C.

In a first embodiment of the present invention, a dielectric film is applied to a substrate before the film is stamped. FIG. 2C shows the dielectric film 210 after application to a substrate 290. The substrate 290 may comprise materials typically used in semiconductor device fabrication, such as silicon or gallium arsenide. The substrate 290 may also contain one or several areas in which semiconductor devices have been created. FIG. 2C shows one such area 291. The dielectric film 210 may be spun-on using a commercial photoresist spinner. The layer 210 may range from 1 μm to 2 mm, depending upon the interconnects or devices to be contained within the layer. The layer 210 comprises dielectric material, such as SU-8 photoepoxy, benzocyclobutene (BCB), polyimide, or other such materials known in the art. SU-8 photoepoxy, commercially available from MicroChem Corporation, Newton, Mass., is particularly suited for this application, since SU-8 may be applied in thicknesses from 1 μm to 2 mm. After application, the layer 210 is baked at a low temperature, preferably around 90° C., to produce a soft, imprintable layer.

After the dielectric layer 210 is applied to the substrate 290, the stamp wafer 200 containing the stamp pattern 201 is aligned to the substrate 290 with the dielectric layer 210. The stamp wafer 200 and the substrate wafer 290 are preferably registered to one another using a commercially available alignment tool with front-to-back alignment capability. The tool should have 0.5-1.0 μm accuracy for wafer-to-wafer alignment. The wafers are preferably fixed in position to one another using a bonding tool, such as the one used with the EV501 wafer bonding machine from EV Group, Inc. of Schaerding, Austria. The bond tool with the wafers is next transferred into a hot embossing machine to produce imprinted structures.

FIG. 2D shows the stamp wafer 200 pressed into the dielectric layer 210. By pressing the stamp wafer 200 into the dielectric layer 210 on the host substrate 290, shaped receptacles, interconnect vias, and connect trenches are formed. A hot embossing machine, such as the EV520HE hot embossing machine from EV Group, performs the molding process under high vacuum conditions with precise temperature and stamping pressure control. The dielectric layer 210 is imprinted at low pressures, typically less than 6.9 atmospheres (100 psi), and at relatively low temperatures, less than 100° C. These parameters are important since high pressures and high temperatures could possibly damage any circuitry on the underlying wafer.

After the imprinting process, the stamp wafer 200 and the host substrate 290 with the now-stamped dielectric layer 210 are separated. If curing of the layer 210 is required, the host substrate 290 with the dielectric layer 210 may then be baked at a temperature sufficient to harden the material or the dielectric layer 210 may be exposed to Ultra-Violet light if photo-curing is needed. Alternatively, the dielectric layer 210 may be left to cool and harden. FIG. 2E shows the host substrate 290 and dielectric layer 210 after the stamp wafer 200 is removed. In FIG. 2E, openings 211 for the vias and a region 213 for receiving a semiconductor device are shown.

The molding process will generally leave a portion of residual film at the bottom of the imprinted via and trench regions as shown at the bottom of the via regions 211 in FIG. 2E. The residual film must be removed to provide connections to the layer underlying the dielectric layer containing interconnections. Typically, the residual film left by the imprinting process is less than one micron thick and is easily removed by a short exposure to a high density argon/oxygen plasma. Prior to plasma etching, the surface of the dielectric layer 210 is patterned with photoresist to expose those areas from which the residual film is to be etched. With high density argon/oxygen plasma etching, etch rates of 3000 Å/min can be accomplished, so the etch exposure is relatively short. Laser ablation techniques may also be used to remove the residual film. Chemical etching is unlikely to be used, since the materials used for the dielectric layer are resistant to most solvents, acids, or bases. FIG. 2F shows the dielectric layer 210 after the residual film has been removed from the bottom of the via regions 211.

The interconnect regions are then metallized as shown in FIG. 2G. FIG. 2G also shows the deposit of a semiconductor device 217 in the dielectric layer 210. The vias 215 may be created by the vacuum deposition of metal films, which is well known in the semiconductor industry. The metal films may be deposited by either an evaporation or sputtering mechanism. The metal films may comprise one or more of the following metals: titanium (Ti), gold (Au), chromium (Cr), nickel (Ni), platinum (Pt), and aluminum (Al). One typical metal film consists of a 500 Å layer of Ti and a 1500 Å layer of Au. The specific thickness of individual layers will depend upon stress and strain considerations within the structure. Masking of the dielectric layer 210 can either be done prior to the deposit of the metal film, in a lift-off process well-known in the art, or after the deposit of metal, in a subtractive process also well known in the art, to form the metal lines on the surface of the dielectric layer 210 and in the via regions 211. Metallization of the interconnect regions is typically accomplished by a multi-step process where a thin metal film, or seed layer, is deposited by vacuum deposition, which is then followed by the formation of a thicker metal film using an electro-chemical process. Other processes known in the art of semiconductor manufacturing may also be used for metallization.

Formation of multiple interconnect layers according to this first embodiment of the present invention is accomplished by repeating the steps described above and shown in FIGS. 2H-2M. In FIG. 2H, the deposit of a second dielectric layer 230 on top of the stamped and metallized dielectric layer 210 and substrate 290 is shown. The second dielectric layer 230 may be deposited by the spin-on process described above. A second stamp wafer 250 with a second stamp pattern 251 is created as shown in FIG. 21. The second stamp wafer 250 is then used to stamp the second dielectric layer 230 as shown in FIG. 2J.

Removal of the second stamp wafer 250 exposes via regions 231 and interconnect trench regions 233 in the second dielectric layer 230 as shown in FIG. 2K. FIG. 2L shows the removal of the residual film at the bottom of these regions 231, 233 to provide access to the interconnect regions 215 and circuit areas 219 in the first dielectric layer 210. Removal of the residual film in the second dielectric layer 230 is accomplished using the same techniques described above for the first dielectric layer 210. Metallization of the via regions 231 and the interconnect trench regions 233 is accomplished using the same techniques as for the first dielectric layer 210. The structure with two layers of interconnects resulting from the processes described above is shown in FIG. 2M.

In an alternative embodiment of the process described above, commercially available sheets of polymer dielectric film may be used to provide the dielectric layers to be molded by stamp wafers. Rather than using a spin-on process to form each dielectric layer, a sheet of polymer dielectric film is positioned and bonded to a host substrate (or an underlying dielectric layer). The dielectric film is then molded as described above. Using sheets of polymer dielectric film with decreasing glass transition temperatures, i.e., temperatures at which the film can be molded, allows the upper layers to be molded without affecting the lower layers.

Figure 3A:
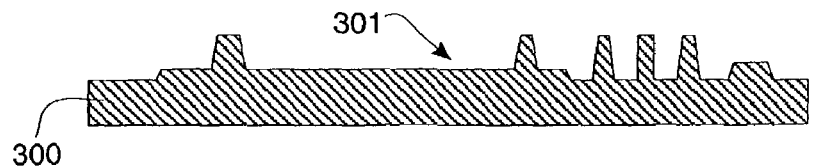
FIGS. 3A-3G illustrate the steps of a method according to another embodiment of the present invention.

Another embodiment of the process for producing high performance interconnects according to the present invention is illustrated in FIGS. 3A to 3G. In FIG. 3A, a stamp pattern 301 is formed on a stamp substrate wafer 300. As described above, the stamp pattern can be formed using standard integrated circuit processes to provide the necessary patterns. The materials for the stamp substrate wafer 300 is chosen from those materials that will support the construction of semiconductor-like structures.

Figure 3B:
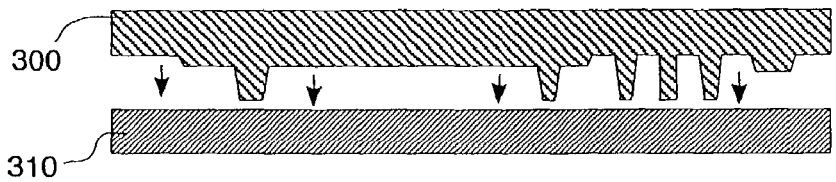

As shown in FIG. 3B, the substrate wafer 300 containing the stamp pattern 301 is then positioned above a sheet of polymer dielectric film 310. Unlike the process described above and illustrated in FIGS. 2A-2M, the sheet of polymer dielectric film 310 is not spun onto an underlying substrate before stamping. Instead, the sheet 310 is separately provided and is stamped prior to its attachment to an underlying circuit-carrying substrate. Micro-stamping processes similar to those described above are then used to stamp the dielectric film 310. As above, the stamping process forms the pre-form structures in the polymer dielectric film 310 that will be used for interconnect metallization.

Figure 3C:
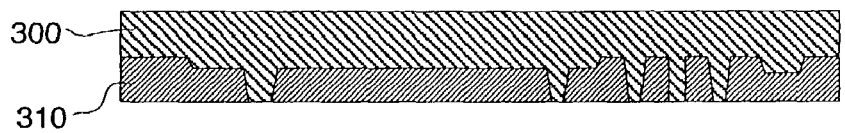

FIG. 3C shows the application of the stamp substrate 300 to the polymer dielectric film 310. The polymer dielectric film 310 is preferably a thermoplastic polymer film, commercially available in a variety of compositions. Such films include polyimide, ethylenechlorotrifluroethylene, polyvinylidene fluoride, and polyetherimide. As in the approach described above for stamping a dielectric film spun on a substrate, a bonding tool is used to fix the stamp substrate wafer 300 next to the dielectric film 310. The bond tool with the stamp wafer 300 and the dielectric film 310 is then transferred into a hot embossing machine.

The embossing machine performs the required molding process for the separate dielectric film 310 using temperatures and pressures similar to those used for molding the dielectric layer on the substrate described above. After stamping and separation of the stamp wafer 300 from the dielectric film 310, the dielectric film 310 is allowed to cool and harden into its final form. Since the dielectric film 310 is fully polymerized, a curing step may not be required. The thermoplastic properties of the materials used for the dielectric film 310 allows the film 310 to be reversibly softened and hardened by heating above and cooling below the glass transition temperature of the materials.

Figure 3D:
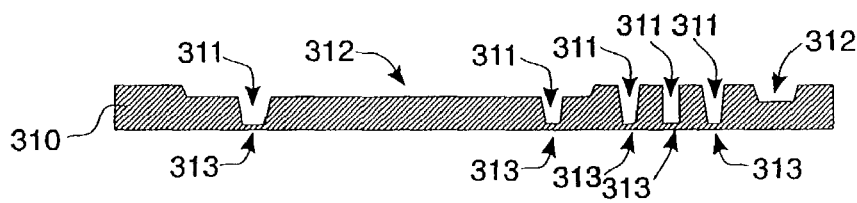

FIG. 3D illustrates the polymer dielectric film after the removal of the stamp pattern, in which the polymer dielectric film 310 contains a plurality of recesses 311 and 312. The shallow recesses 312 provide the structures required to support intralayer connections, i.e. horizontal interconnects. The deep recesses 311 provide the structures required to support interlayer connections, i.e. vertical interconnects or vias. After the polymer dielectric film 310 is micro-stamped, a polymer residue 313 is left at the bottom of the deep recesses 311, which will subsequently be removed.

Figure 3E:
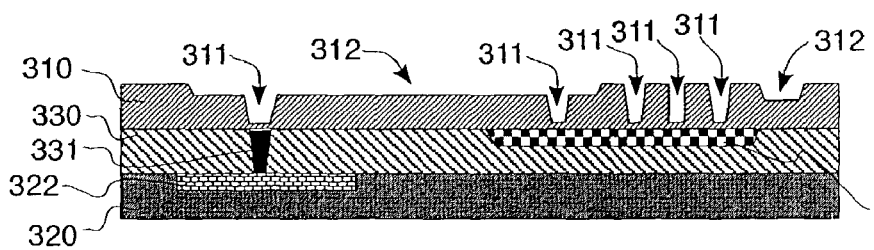

FIG. 3E shows the placement of the stamped dielectric film 310 on the top of the three dimensional structure. In FIG. 3E the stamped dielectric film 310 is placed on top of a second dielectric film 330 that has already been stamped, metallized, and contains one or more integrated circuits 332. The second dielectric film 330 may be disposed on a circuit carrying substrate 320 with one or more integrated circuit regions 322 to form a three-dimensional structure. A commercially available wafer bonder/aligner equipped with double-sided alignment capability may be used to precisely register and attached the patterned dielectric film 330 to the top layer of the three-dimensional structure.

Figure 3F:
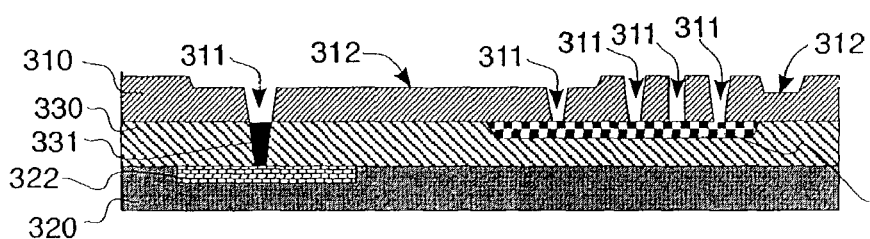

FIG. 3F shows the dielectric film 310 after the polymer residue 313 has been removed. Removal of this residue is performed using the same techniques described above, that is, patterning with photoresist and removal with plasma etching or laser ablation. Removal of the polymer residue 313 exposes vias 331 or integrated circuits 332 in the layer 330 below.

Figure 3G:
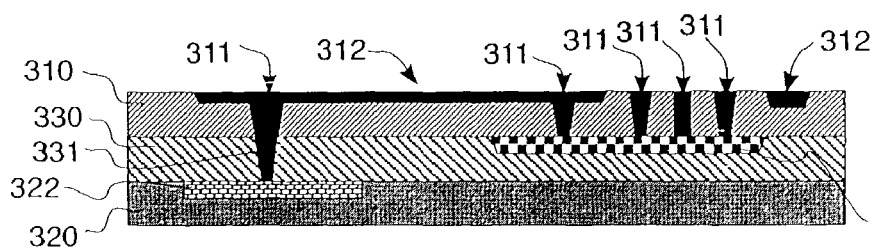

After the polymer residue 313 is removed, metallization of the interconnect regions 311, 312 occurs. FIG. 3G illustrates the metallization of the interconnect regions 311, 312. Metallization in this embodiment of the process according to the present invention is performed in the same manner as previously discussed. Vacuum deposition is used to apply the metal and a lift-off process or subtractive process is used to form the vias and interconnect trenches.

High-performance interconnections are essential for horizontal transport of DC and RF signals among embedded circuits within a layer and for vertical connectivity between layers in a multiple layer structure. The multiple layers of metallized dielectrics of the present invention enable the creation of a wide variety of transmission lines and interconnects. Such structures include conductors with one or two ground planes (microstrip and stripline, respectively), coplanar strips (CPS) and three-conductor coplanar waveguide (CPW). These transmission lines are used extensively in MMICs and conventional RF printed circuits. Using low-loss dielectrics and mode suppression techniques developed for millimeter-wave MMICs and subsystems, operation at frequencies up to 100 GHz will be practical. The vertical dimension adds another degree of freedom through which shielded structures such as coaxial lines and transmission line vias can be formed, as illustrated in FIG. 1. The capacity for vertical RF interconnects between levels with controlled impedance, coupling, and radiation characteristics is one of the unique potential benefits of the present invention.

The present invention can be used to provide complex interconnects of various shapes and functions. FIGS. 4-8 illustrate some of the complex interconnect structures that may be fabricated using the methods described above.

Figure 4:
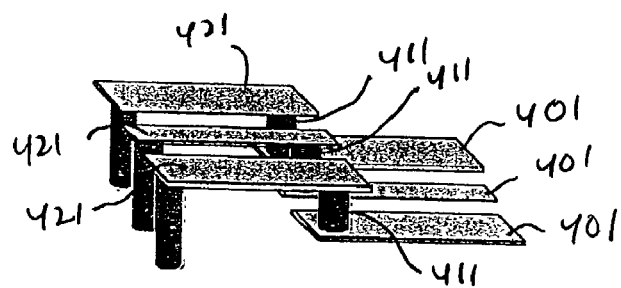
FIG. 4 illustrates a coplanar interconnect provided by a method according to an embodiment of the present invention.

For example, as illustrated in FIG. 4, a coplanar interconnect between layers can be provided by the present invention. In FIG. 4, three metal lines 401 form a three conductor coplanar waveguide disposed on a lower layer. Three vertical interconnects 411 provide the electrical connections to a three conductor coplanar waveguide comprising three metal lines 421 formed on an upper layer.

Figure 9A:
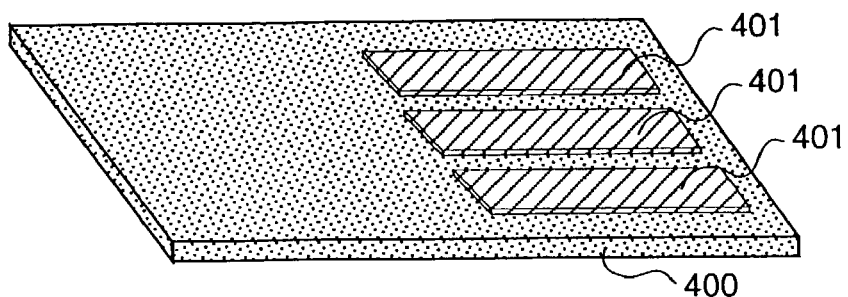
FIGS. 9A-9D illustrate the steps of a method according to an embodiment of the present invention used to form the coplanar interconnect depicted in FIG. 4.
Figure 9B:
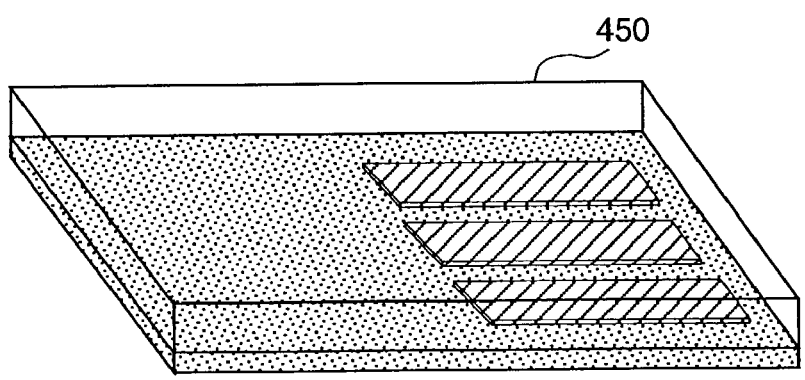
Figure 9C:
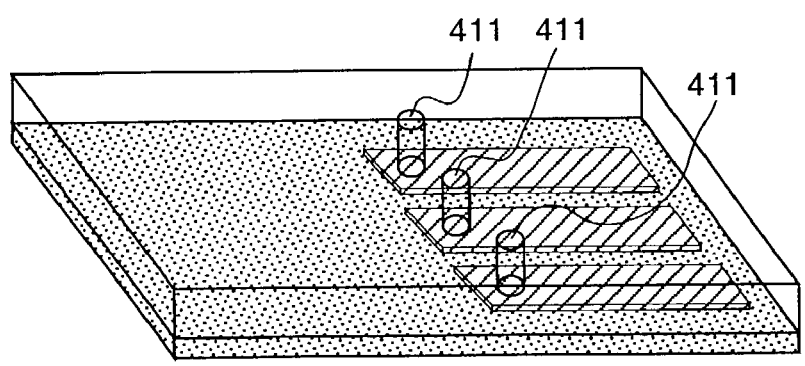
Figure 9D:
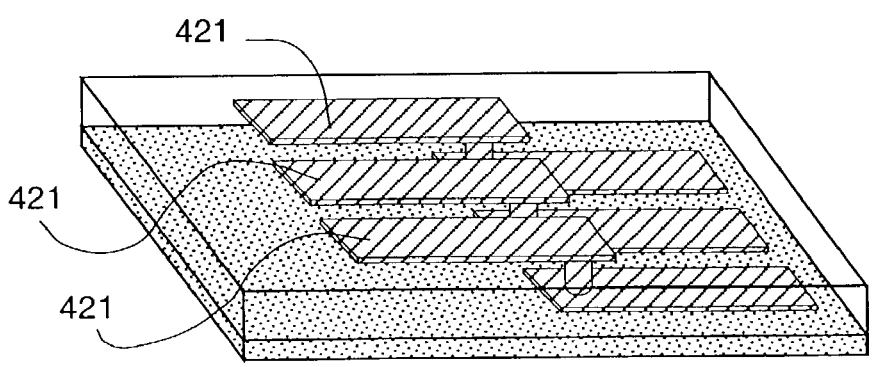

FIGS. 9A-9D illustrate the steps used to fabricate the coplanar interconnect illustrated in FIG. 4. The first step, as shown in FIG. 9A, is the formation of metal lines 401 on a lower layer 400. The lower layer 400 may comprise a semiconductor substrate or a previously deposited polymer layer. The metal lines 401 may be formed by semiconductor fabrication techniques well known in the art. In FIG. 9B, an upper polymer layer 450 is then deposited on top of the lower layer 400 and the metal lines 401. As previously discussed, the polymer layer 450 may comprise polyimide, BCB, SU-8, or other suitable thermoplastic material chosen for suitable RF or other electrical properties and with a glass transition temperature lower than that of the layer 400 below (if it also comprises thermoplastic material). FIG. 9C illustrates the formation of via holes 411 in the upper polymer layer 450 using the imprinting methods described above. The imprinting stamp is accurately aligned to the lower layer 400 to ensure proper placement of the via holes above the metal lines 401. Note that the imprinting allows deep via holes 411 to be created with high aspect ratios, so that the second polymer layer 450 may be relatively thick, if required for proper device operation. FIG. 9D illustrates the final step in the fabrication of the coplanar waveguide interconnects. In FIG. 9D, the via holes 411 are filled with metal and metal is also deposited to form the metal lines 421 on the upper layer 450. The three upper layer metal lines 421 provide the upper layer coplanar waveguide.

Figure 5:
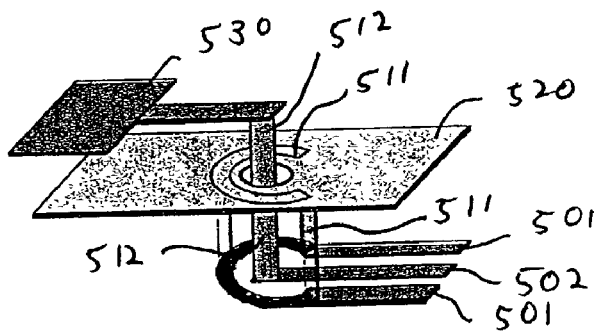
FIG. 5 illustrates a coaxial wave-guiding provided by a method according to an embodiment of the present invention.

Coaxial connections can also be provided by the present invention as shown in FIG. 5. In FIG. 5, a lower layer coaxial transmission line is formed by a center conductor 502 located between two shield lines 501. A coaxial connection to an upper layer device, such as a patch antenna 530, is provided by a center conductor vertical interconnect 512 connected to the center conductor 502 and a ground shield 511 which is connected to the shield lines 501. As shown in FIG. 5, the center conductor vertical interconnect may then be connected to a patch antenna 530, while the shield structure 511 is connected to a layer of metal 520 that serves as a ground plane for the patch antenna 530.

Figure 10A:
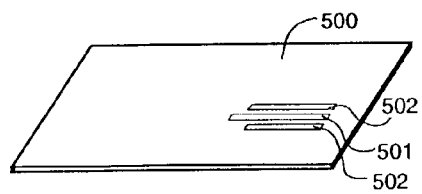
FIGS. 10A-10H illustrate the steps of a method according to an embodiment of the present invention used to form the coaxial wave-guiding interconnect depicted in FIG. 5.
Figure 10E:
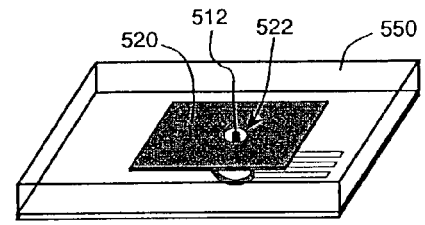
Figure 10B:
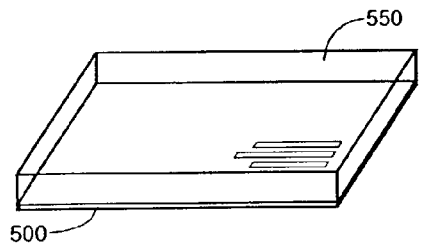
Figure 10F:
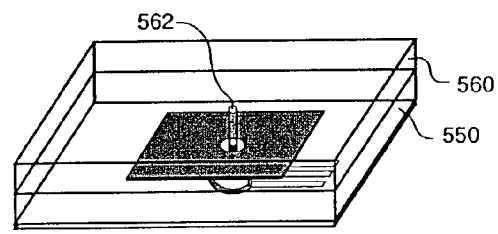
Figure 10C:
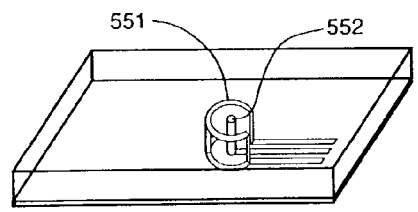

FIGS. 10A-10H illustrate the fabrication of the coaxial connection depicted in FIG. 5. The first step, as shown in FIG. 10A is the formation of the center conductor 502 and the shield lines 501 on a lower layer 500. The lower layer 500 may comprise a semiconductor substrate or a previously deposited polymer layer. The center conductor 502 and the shield lines 501 may comprise metal lines formed by semiconductor fabrication techniques well known in the art. FIG. 10B depicts the next step, where an upper polymer layer 550 is deposited on top of the lower layer 500. The upper polymer layer 550 is then stamped to form a center conductor recess 552 and a coaxial ground shield recess 551, as shown in FIG. 10C. The high aspect ratios provided by the methods according to the present invention allow these complex structures to be created. Accurate alignment of the imprinting stamp with a host circuit wafer carrying the lower layer 500 allows the recesses to be closely aligned with the center conductor 502 and the shield line 501.

Figure 10G:
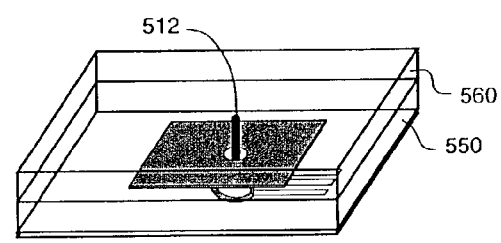
Figure 10D:
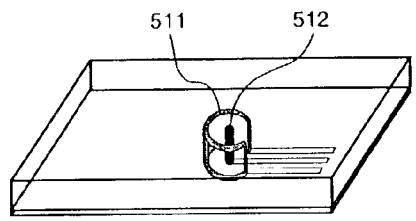

Metal, such as gold, titanium/gold, or other such conductors, is then deposited into the center conductor recess 552 and the coaxial ground shield recess 551 to form the lower layer portion of the center conductor vertical interconnect 512 and the ground shield 511, as shown in FIG. 10D. Lift-off techniques or chemical-mechanical polishing techniques may be required at this point to properly define the terminating ends of the center conductor 512 and ground shield 511. FIG. 10E illustrates the fabrication of the ground plane 520 by metal deposition, such as by the evaporation of titanium/gold or gold onto the upper polymer layer 550. Lift-off techniques may be employed to create a cleared circular area 522 (free of metal) for the center conductor vertical interconnect 512 to pass through the ground plane 520.

Figure 10H:
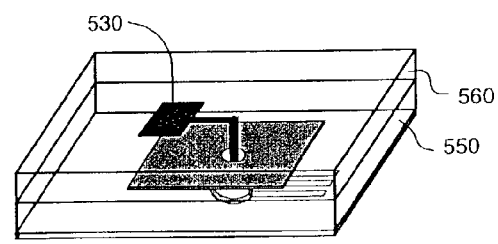

FIG. 10F illustrates the formation of a second polymer layer 560 on top of the first polymer layer 550. The material for the second polymer layer 560 may again be chosen from polyimide, BCB, SU-8, or other thermoplastic materials with a lower glass transition temperature than the first polymer layer 550. A second layer center conductor recess 562 may be formed in the second polymer layer 560 by the stamping techniques previously described. The second layer center conductor recess 562 may also be formed by semiconductor techniques such as plasma etching. The second layer center conductor recess 562 is then filled with metal, such as gold, or titanium/gold, to complete the formation of the center conductor 512, as shown in FIG. 10G. The final step in the formation of the coaxial structure shown in FIG. 5 is the deposition of metal on top of the second polymer layer 560 to form the patch antenna 530, as shown in FIG. 10H.

Figure 6:
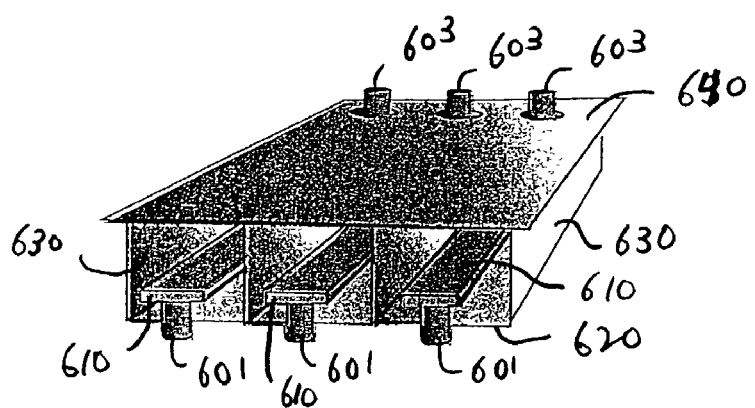
FIG. 6 illustrates shielded, horizontal transmission lines provided by a method according to an embodiment of the present invention.

Shielded horizontal transmission lines can be provided by the present invention as shown in FIG. 6. In FIG. 6, horizontal interconnects 610 are positioned between a lower ground plane 620 and an upper ground plane 640. The horizontal interconnects 610 are further shielded from each other by vertical ground shields 630 disposed between the horizontal interconnects 610. Lower vertical interconnects 601 and upper vertical interconnects 603 are insulated from the lower ground shield 620 and the upper ground shield 640 and connect to the horizontal interconnects 610.

Figure 11A:
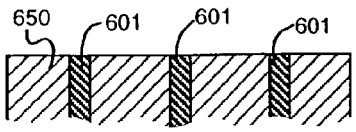
FIG. 11A-11L illustrate the steps of a method according to an embodiment of the present invention used to form the shielded, horizontal transmission line interconnect depicted in FIG. 6.
Figure 11B:
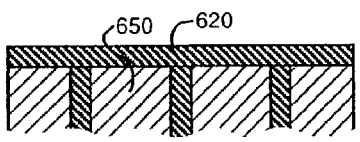
Figure 11C:
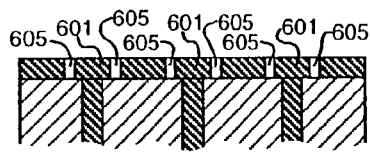

One method for forming the shielded horizontal transmission line structure depicted in FIG. 6 is shown in FIGS. 11A-11L. The first step is depicted in FIG. 11A, where the lower level interconnects 601 are formed within a lower polymer layer 650 by the stamping techniques previously described or by semiconductor techniques well-known in the art. As shown in FIG. 11B, the lower ground shield 620 is then deposited on top of the lower polymer layer 650. The lower level interconnects 601 may have been chemically-mechanically polished or otherwise prepared to ensure a good electrical connection between the lower level interconnects 601 and the metal deposited on top of the lower polymer layer 620. Lift-off techniques or other metal removal techniques are used to remove the metal from the lower ground shield 620 around the lower vertical interconnects 601 to form insulating gaps between the lower vertical interconnects 601 and the lower ground shield 620, as shown in FIG. 11C.

Figure 11H:
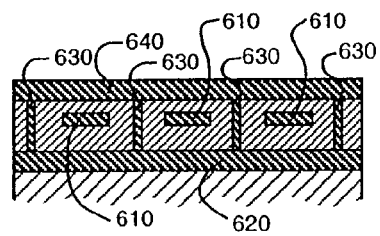
Figure 11D:
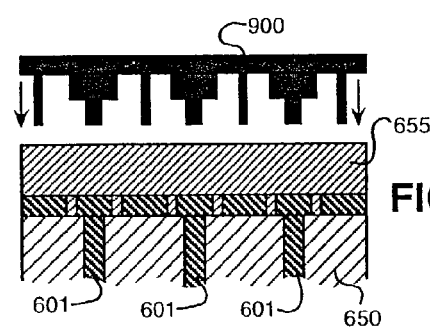
Figure 11I:
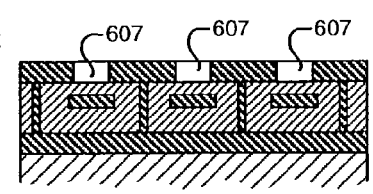
Figure 11E:
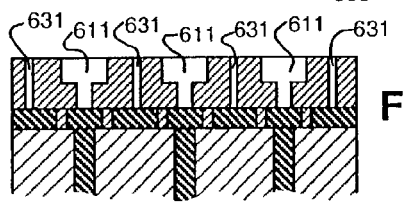

A middle polymer layer 655 is then deposited on top of the lower ground shield 620 and a stamp 900 is prepared for stamping the required structures in the middle polymer layer 655, as shown in FIG. 11D. The middle polymer layer 655 is then stamped and further fabricated using the techniques previously described to provide the vertical shield recesses 631 and the horizontal interconnect recesses 611 as shown in FIG. 11E. Accurate alignment of the stamp or of the imprinted middle polymer layer 655 ensures proper placement of the interconnect structures.

Figure 11J:
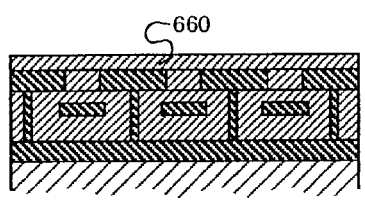
Figure 11F:
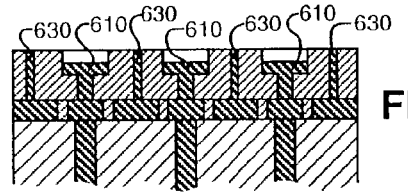

The vertical shield recesses 631 and the horizontal interconnect recesses 611 are then metalized as shown in FIG. 11F. Multiple metallization steps are preferably used to deposit all of the metal required to completely fill the vertical shield recesses 631 to form the vertical shields 630, while only partially filling the horizontal interconnect recesses 611 to form the horizontal interconnects. After metallization, additional polymer is deposited to provide insulating layer sections 651 above the horizontal interconnects 610 as shown in FIG. 11G.

FIG. 11H shows the structure from the side of the horizontal interconnects 610 where the upper vertical interconnects 603 are to be provided after the upper ground shield 640 is deposited on top of the middle polymer layer 655. Chemical-mechanical polishing or other preparation techniques may be used to ensure good electrical connectivity between the vertical shields 630 and the upper ground shield 640. Lift-off techniques or other metal removal techniques are used to provide upper interconnect holes 607 in the upper ground shield 640, as shown in FIG. 11I. An upper polymer layer 660 is then deposited on top of the upper ground shield 640 and to fill in the upper interconnect holes 607, as shown in FIG. 11J.

Figure 11K:
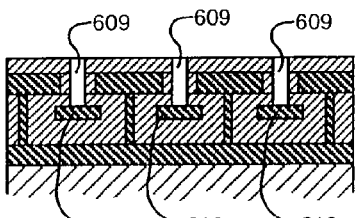
Figure 11G:
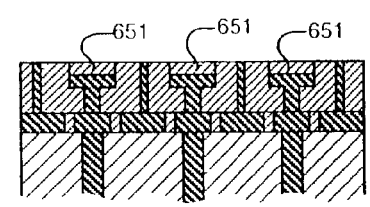
Figure 11L:
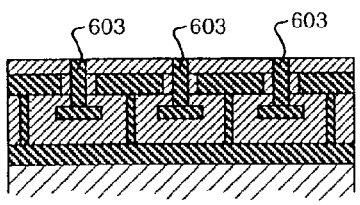

Etching is then used to remove the polymer material above the horizontal interconnects 610 to provide upper interconnect recesses 609, as shown in FIG. 11K. Plasma etching is preferred for the removal of the polymer material, since the polymer materials in the upper polymer layer 660 and the middle polymer later 655 are likely to have different glass transition temperatures. The upper interconnect recesses 609 are then filled with metal to form the upper vertical interconnects 603, as shown in FIG. 11L.

Figure 7:
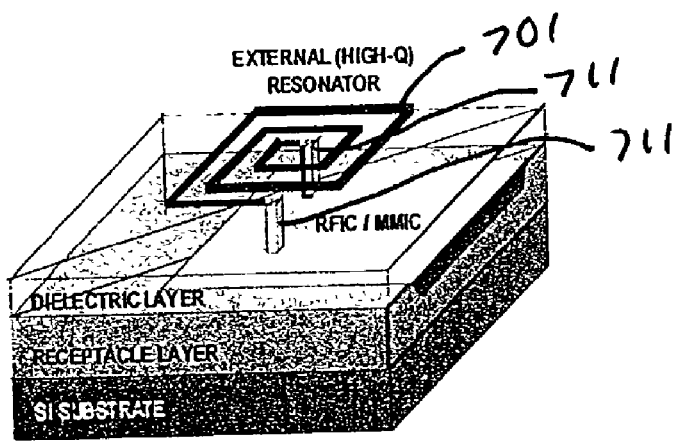
FIG. 7 illustrates an external resonator provided by a method according to an embodiment of the present invention.

Due to the lossy nature of silicon substrates, external resonators are needed for improving the RF performance of Si circuits. FIG. 7 shows a printed-metal spiral inductor 701 used for tuning a RF integrated circuit connected to an integrated circuit by vias 711. The process provided by the present invention results in integration technology that is superior to low-temperature cofired ceramic (LTCC), for example, that is typically used in such an application. Micro-stamped vias provide a vertically integrated structure that is more compact and repeatable, and produces smaller and more consistent electrical parasitic effects.

Figure 8:
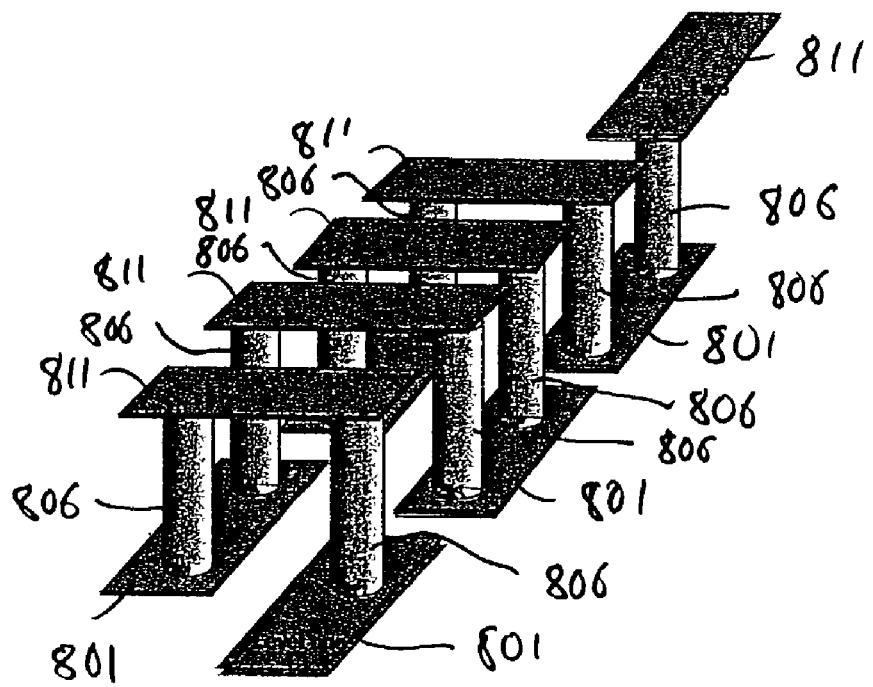
FIG. 8 illustrates a horizontal, spiral inductor provided by a method according to an embodiment of the present invention.

Similarly, the present invention provides the capability to produce a horizontal spiral inductor, as shown in FIG. 8. The spiral inductor is provided by the interconnection of lower layer metal lines 801, vertical interconnects 806, and upper layer metal lines 811. The techniques for forming the horizontal inductor shown in FIG. 8 are similar to those used to form the coplanar interconnect shown in FIG. 4.

From the foregoing description, it will be apparent that the present invention has a number of advantages, some of which have been described above, and others of which are inherent in the embodiments of the invention described herein. Also, it will be understood that modifications can be made to the process for producing high performance interconnects described herein without departing from the teachings of subject matter described herein. As such, the invention is not to be limited to the described embodiments except as required by the appended claims.

What is claimed is:

1. A method for producing electrical interconnections in a three dimensional semiconductor structure, comprising the steps of:
   (a) applying a dielectric film to a top portion of the three dimensional semiconductor structure;
   (b) providing a stamp substrate;
   (c) etching the stamp substrate to create a stamp pattern with raised areas;
   (d) aligning the stamp substrate to the dielectric film;
   (e) imprinting the dielectric film with the stamp pattern on the stamp substrate so as to create via regions and/or trench regions in the dielectric film;
   (f) removing residual film from the via and/or trench regions of the dielectric film; and
   (g) metallizing the via and/or trench regions of the dielectric film to provide electrical interconnections.

2. The method according to claim 1, further comprising the steps of
   (h) applying another layer of dielectric film on the top portion of the three dimensional semiconductor structure; and
   (i) repeating steps (c)-(g) for each additional layer of dielectric film applied.

3. The method according to claim 1 further comprising the step of coating the stamp substrate with a release agent prior to performing the step of imprinting the dielectric film.

4. The method according to claim 1 wherein the step of applying a dielectric film comprises spinning on the dielectric film with a photoresist spinner.

5. The method according to claim 1 wherein the step of applying a dielectric film comprises bonding a sheet of dielectric film.

6. The method according to claim 1 wherein the step of imprinting the dielectric film comprises molding the dielectric film under high vacuum conditions with precise temperature and imprinting pressure control.

7. The method according to claim 1 wherein the step of imprinting the dielectric film further comprises the step of hardening the dielectric film by baking the dielectric film.

8. The method according to claim 1 wherein the step of imprinting the dielectric film further comprises the step of hardening the dielectric film by exposing the dielectric film to ultraviolet light.

9. The method according to claim 1 wherein the step of removing residual film comprises the steps of:
   patterning the dielectric film with photoresist, and
   plasma etching the dielectric film.

10. The method according to claim 1 wherein the step of removing residual film comprises the steps of:
    patterning the dielectric film with photoresist, and
    laser ablating the residual film.

11. The method according to claim 1 wherein the step of metallizing the via and/or trench regions comprises vacuum depositing metal films.

12. The method according to claim 11 wherein the metal films comprise one or more of the metals from the group consisting of titanium, gold, chromium, nickel, platinum, and aluminum.

13. A method for producing high performance electrical interconnections in a three dimensional semiconductor structure, comprising the steps of:
    (a) providing a stamp substrate;
    (b) etching the stamp substrate to create a stamp pattern with raised areas;
    (c) providing a dielectric film;
    (d) aligning the stamp substrate to the dielectric film;
    (e) imprinting the dielectric film with the stamp pattern on the stamp substrate so as to create via regions and/or trench regions in the dielectric film;

(f) aligning the dielectric film to a top portion of the three dimensional semiconductor structure;

(g) bonding the dielectric film to the three dimensional semiconductor structure;

(h) removing residual film from the via and/or trench regions of the dielectric film; and (i) metallizing the via and/or trench regions of the dielectric film.

14. The method according to claim 13 wherein steps (b)-(i) are repeated to form a multiple layer structure.

15. The method according to claim 13 wherein the step of imprinting the dielectric film comprises molding the dielectric film under high vacuum conditions with precise temperature and imprinting pressure control.

16. The method according to claim 13 wherein the step of imprinting the dielectric film further comprises the step of hardening the dielectric film by baking the dielectric film.

17. The method according to claim 13 wherein the step of imprinting the dielectric film further comprises the step of hardening the dielectric film by exposing the dielectric film to ultraviolet light.

18. The method according to claim 13 wherein the step of removing residual film comprises the steps of:
    patterning the dielectric film with photoresist, and
    plasma etching the dielectric film.

19. The method according to claim 13 wherein the step of removing residual film comprises the steps of:
    patterning the dielectric film with photoresist, and
    laser ablating the residual film.

20. The method according to claim 13 wherein the step of metallizing the via and/or trench regions comprises vacuum depositing metal films.

21. The method according to claim 20 wherein the metal films comprise one or more of the metals from the group consisting of titanium, gold, chromium, nickel, platinum, and aluminum.

22. A method for forming coplanar interconnects between layers in a multiple layer three dimensional structure, the method comprising:
    forming one or more lower layer metal lines on a lower layer;
    depositing a polymer layer on top of the metal lines on the lower layer;
    forming via holes in the polymer layer directly above the metal lines on the lower layer;
    metallizing the via holes to provide vertical electrical connections to the lower layer metal lines; and,
    forming one or more upper layer metal lines on top of the polymer layer, the one or more upper layer metal lines electrically connecting to the vertical electrical connections.

23. The method according to claim 22, wherein the step of forming via holes comprises:
    providing a stamp substrate;
    etching the stamp substrate to create a stamp pattern with raised areas corresponding to the via holes;
    aligning the stamp substrate to the polymer layer;
    imprinting the polymer layer with the stamp pattern on the stamp substrate so as to create the via holes; and
    removing residual polymer from the via holes.

24. A method for forming a coaxial connection between layers in a multiple layer three dimensional structure, the method comprising:
    forming a coaxial line structure on a lower layer, the coaxial line structure comprising a pair of lower layer metal shield lines with a lower layer center conductor line disposed between the lower layer metal shield lines and electrically isolated from the lower layer metal shield lines;
    depositing a first polymer layer on top of the coaxial line structure on the lower layer;
    forming a center conductor recess and a ground shield recess in the first polymer layer directly above the coaxial line structure on the lower layer, the center conductor recess formed above the lower layer center conductor line at one end of the lower layer center conductor line and the ground shield recess formed above ends of the pair of lower layer metal shield lines adjacent to the end of the lower layer center conductor line, the ground shield recess substantially surrounding the center conductor recess; and,
    metallizing the center conductor recess and the ground shield recess to provide a vertical center conductor and a vertical ground shield, the vertical center conductor being in electrical connection with the lower layer center conductor and the vertical ground shield in electrical connection with the lower layer metal shield lines.

25. The method according to claim 24, further comprising the steps of:
    depositing a metal ground layer on top of the first polymer layer, the metal ground layer in electrical connection with the vertical ground shield;
    removing metal from the metal ground layer above the vertical center conductor to form an open area in the metal layer with a greater diameter than the vertical center conductor;
    depositing a second polymer layer on top of the metal ground layer;
    forming a via hole in the second polymer layer above the vertical center conductor; and
    metallizing the via hole to provide a second vertical connection to the vertical center conductor.

26. The method according to claim 25, further comprising the step of depositing a patch antenna metal structure on top of the second polymer layer, the patch antenna metal structure being electrically connected at one end of the second vertical connection.

27. The method according to claim 24, wherein the step of forming a center conductor recess and a ground shield recess comprises:
    providing a stamp substrate;
    etching the stamp substrate to create a stamp pattern with raised areas corresponding to the center conductor recess and the ground shield recess;
    aligning the stamp substrate to the first polymer layer;
    imprinting the first polymer layer with the stamp pattern on the stamp substrate so as to create the center conductor recess and the ground shield recess; and
    removing residual polymer from the center conductor recess and the ground shield recess.

28. A method for forming shielded horizontal transmission line interconnections between layers in a multiple layer three dimensional structure, the method comprising:
    depositing a lower metal layer on a lower layer containing one or more lower level metal interconnects, each lower level interconnect being electrically connected to the lower metal layer at a lower connect area;
    removing metal from the lower metal layer around each lower connect area to form insulating gaps between each lower connect area and the lower metal layer;
    depositing a first polymer layer on top of the lower metal layer;

forming vertical shield recesses and horizontal interconnect recesses in the first polymer layer, the vertical shield recesses being formed above and contacting areas of the metal layer adjacent to the insulating gaps and each vertical shield recess projecting in a horizontal direction in the first polymer layer parallel to each other vertical shield recess, and each horizontal interconnect recess having one end formed above and contacting one of the lower contact areas and having a horizontal trench formed between the vertical shield recesses with a first end and a second end, the first end of the horizontal trench at the end of the horizontal interconnect recess above the lower connect area;

metallizing the vertical shield recesses to form vertical shields in electrical contact with the lower metal layer;

metallizing the horizontal interconnect recesses to form horizontal interconnects, each horizontal interconnect having a first end in electrical contact with one of the lower contact areas and a second end, the horizontal interconnects having a height less than a height of the horizontal interconnect recesses;

depositing a second polymer layer to form insulating sections above the horizontal interconnects;

depositing an upper metal layer on top of the first polymer layer, the upper metal layer being in electrical contact with the vertical shields;

removing metal from the upper metal layer above the second end of each horizontal interconnect to form upper interconnect holes;

depositing a third polymer layer on the upper metal layer and in the upper interconnect holes;

forming upper interconnect recesses in the second polymer layer above the second end of each horizontal interconnect and in the third polymer layer above and through the upper interconnect holes;

metallizing the upper interconnect recesses to form upper vertical interconnects.

29. The method according to claim 28, wherein the step of forming vertical shield recesses and horizontal interconnect recesses comprises:

providing a stamp substrate;

etching the stamp substrate to create a stamp pattern with raised areas corresponding to the vertical shield recesses and horizontal interconnect recesses;

aligning the stamp substrate to the first polymer layer;

imprinting the first polymer layer with the stamp pattern on the stamp substrate so as to create the vertical shield recesses and horizontal interconnect recesses; and removing residual polymer from the vertical shield recesses and horizontal interconnect recesses.

* * * * *